(12) United States Patent
Yang

(10) Patent No.: US 8,371,719 B2
(45) Date of Patent: Feb. 12, 2013

(54) ILLUMINATION APPARATUS WITH HEAT SINKS

(75) Inventor: Sung-Hsiang Yang, Miao-Li Hsien (TW)

(73) Assignee: Foxsemicon Integrated Technology, Inc., Chu-Nan, Miao-Li Hsien (TW)

(*) Notice: Subject to any disclaimer, the term of this patent is extended or adjusted under 35 U.S.C. 154(b) by 19 days.

(21) Appl. No.: 13/237,972

(22) Filed: Sep. 21, 2011

(65) Prior Publication Data

US 2012/0300482 A1   Nov. 29, 2012

(30) Foreign Application Priority Data

May 24, 2011   (TW) .................................. 100118145

(51) Int. Cl.
*F21V 29/00*   (2006.01)

(52) U.S. Cl. ......... 362/294; 165/80.3; 257/712; 313/45; 362/218; 362/373

(58) Field of Classification Search ................. 165/80.3, 165/104.33; 257/712; 313/45; 362/218, 362/294, 373, 547
See application file for complete search history.

(56) References Cited

U.S. PATENT DOCUMENTS

| | | | | |
|---|---|---|---|---|
| 7,744,251 B2* | 6/2010 | Liu et al. | | 362/294 |
| 8,061,869 B2* | 11/2011 | Lo | | 362/249.02 |
| 2009/0194254 A1* | 8/2009 | Zhou et al. | | 165/80.3 |
| 2011/0074265 A1* | 3/2011 | Van De Ven et al. | | 313/46 |

* cited by examiner

Primary Examiner — Stephen F Husar
(74) Attorney, Agent, or Firm — Altis Law Group, Inc.

(57) ABSTRACT

An illumination apparatus comprises a base, a heat sink group, and at least one fastening arm. The base is made of material with high heat conductivity and has a first surface and an opposite second surface for receiving a light source. The heat sink group is placed on the first surface and comprises three types of heat sinks arranged in three lines extending along a lengthwise direction of the base. The fastening arm has a recess defined therein. First and second heat sinks are alternately arranged on each of outer two lines of the heat sink group. Third heat sinks are arranged on the middle line. Each third heat sink is positioned between two first heat sinks at one side thereof and two second heat sinks at the other side thereof.

11 Claims, 3 Drawing Sheets

ILLUMINATION APPARATUS WITH HEAT SINKS

BACKGROUND

1. Technical Field

The present disclosure generally relates to an illumination apparatus and particularly to an illumination apparatus with an LED (light emitting diode) light source and a plurality of heat sinks.

2. Description of the Related Art

Light emitting diodes (LEDs) have many advantages, such as high luminosity, low operational voltage, low power consumption, compatibility with integrated circuits, easy driving, long term reliability, and environmental friendliness; thus, LEDs have been widely promoted as a light source.

However, the light emitting diode produces considerable heat during high power operation, and thus requires a heat sink to dissipate the heat and extend the life span of the LED. A frequent arrangement of heat dissipating tubes of a heat sink is that they all have substantially the same height and arranged in an array. The outside heat dissipating tubes in this arrangement, however, obstruct the airflow throughout the heat sink. Efficiency of the inside heat dissipating tubes is correspondingly lower than the outside heat dissipating tubes, thereby affecting the overall heat dissipating efficiency of the heat sink.

BRIEF DESCRIPTION OF THE DRAWINGS

Many aspects of the present illumination apparatus can be better understood with reference to the following drawings. The components in the drawings are not necessarily drawn to scale, the emphasis instead being placed upon clearly illustrating the principles of the present illumination apparatus. Moreover, in the drawing, like reference numerals designate corresponding parts throughout the several views.

DETAILED DESCRIPTION

Embodiments of an illumination apparatus are described in detail here with reference to the drawings.

Figure 1:
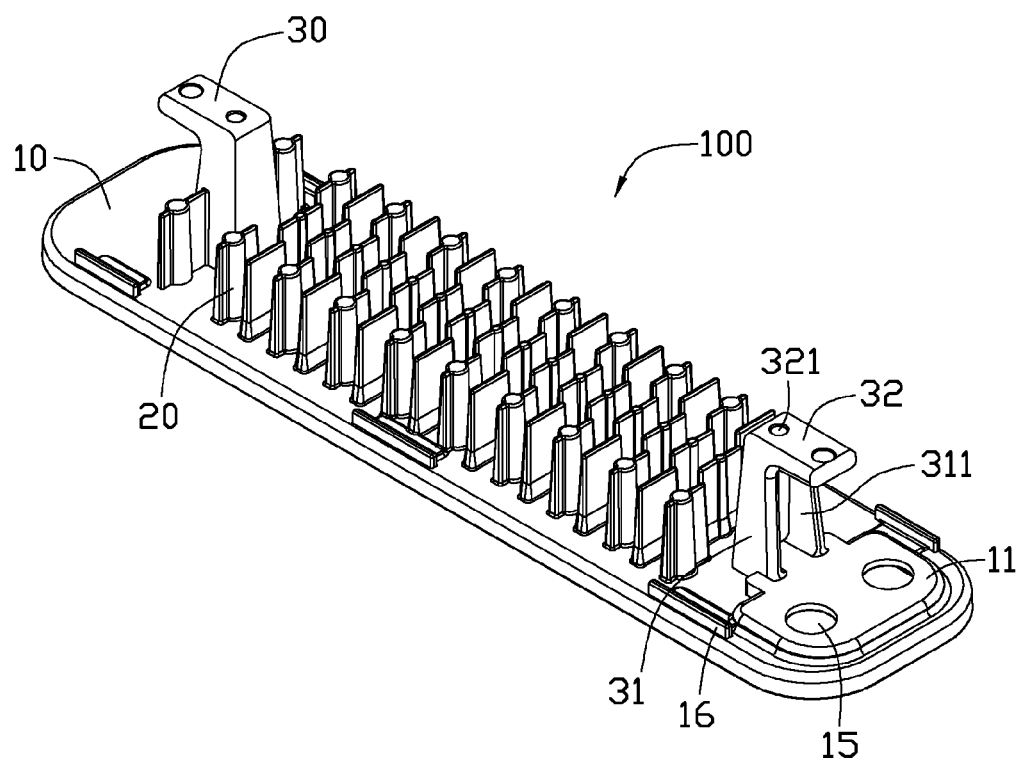
FIG. 1 is an isometric view of an illumination apparatus in accordance with an embodiment.
Figure 2:
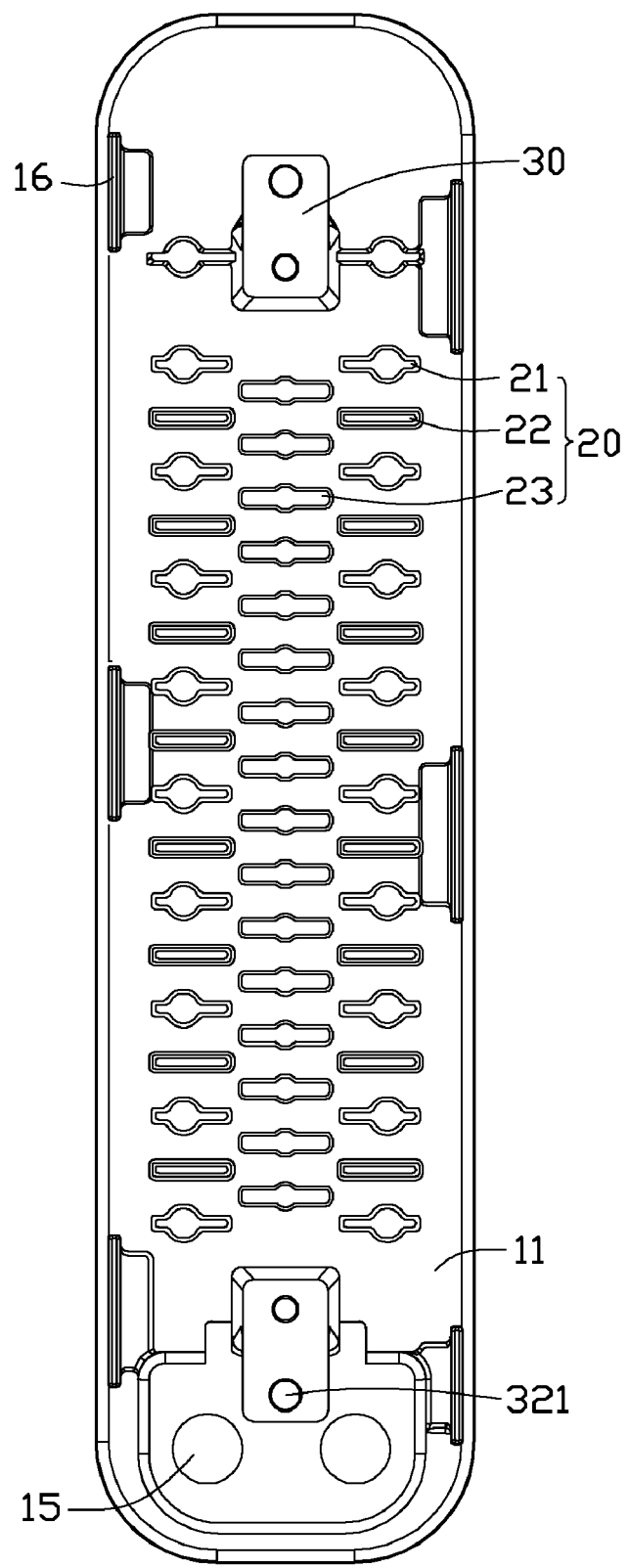
FIG. 2 is a schematic, top plan view of the illumination apparatus of FIG. 1.
Figure 3:
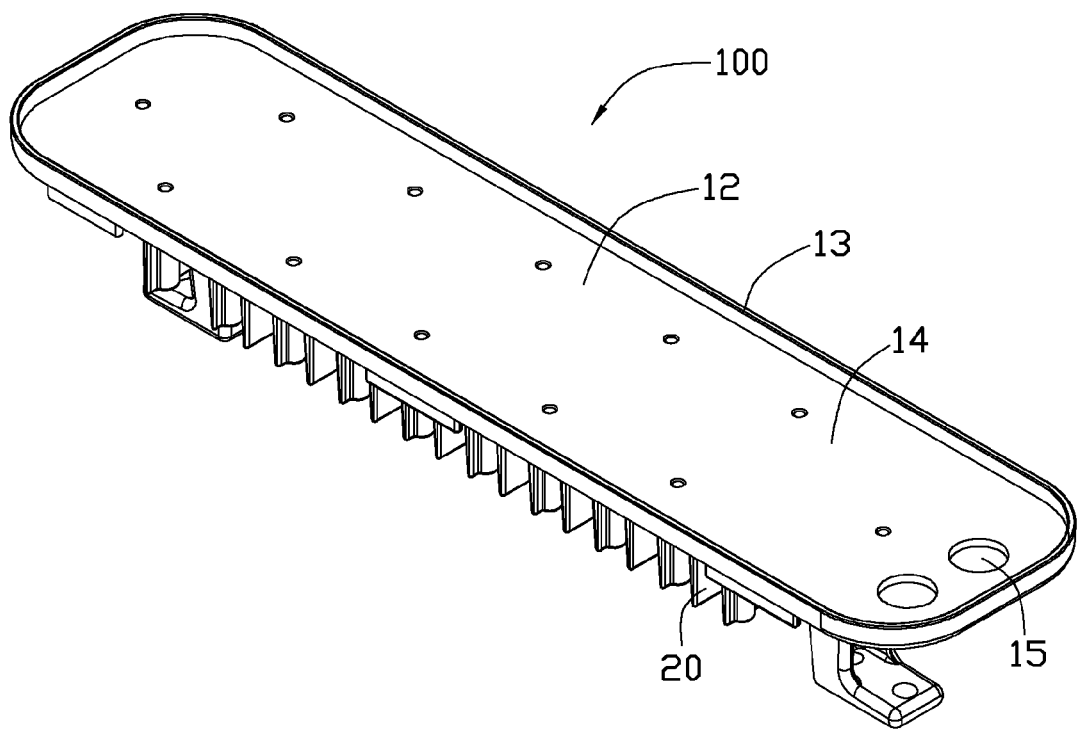
FIG. 3 is an isometric reverse view of the illumination apparatus of FIG. 1.

Referring to FIGS. 1-3, an illumination apparatus 100 in accordance with an embodiment includes a base 10, a heat sink group 20, and two fastening arms 30. The base 10 is made of material with good heat conductibility, such as metal, to absorb heat generated by an LED light source (not shown) attached on a bottom of the base 10. The base 10 includes a first surface 11 and an opposite second surface 12. A retaining wall 13 extends outwards from a periphery of the second surface 12, such that a receiving space 14 is defined by the second surface 12 and the retaining wall 13. The receiving space 14 is configured for receiving the LED light source. The retaining wall 13 may be perpendicular to the second surface 12 or not, and is not limited to be positioned at the edge of the second surface 12. In addition, the retaining wall 13 may have a continuous or discontinuous ring-like shape.

The base 10 has a through hole 15 located at one end thereof, and extending through the first surface 11 and the second surface 12. The through hole 15 is configured for an electrical wire to extend therethrough to electrically connect the LED light source received in the receiving space 14 and an outer power supply.

A number of locking portions 16 are located at two opposite sides of the first surface 11 of the base 10, which correspond to a cover (not shown) to envelop the LED light source in the receiving space 14, such that damage or contamination of the LED light source can be avoided. The cover has engaging tabs for engaging with the locking portions 16 to secure the cover to the base 10.

The heat sink group 20 is placed on the first surface 11 of the base 10 and extends upwardly, which is composed of a number of heat sinks spaced apart from each other. In the present embodiment, the heat sink group 20 comprises three types of heat sinks arranged in three lines extending along a lengthwise direction of the base 10. Each type of heat sinks is consisted of a certain number of heat sinks. Two outer lines of the heat sink group 20 each are consisted of a number of first heat sinks 21 and a number of second heat sinks 22 alternating with each other. The first and second heat sinks 21, 22 are evenly spaced apart from each other. The two lines are symmetrical relative to a longitudinal median of the base 10. The middle line of the heat sink group 20 is occupied by a number of third heat sinks 23 spaced apart from each other, and each of the third heat sinks 23 is located between two neighboring first heat sinks 21 at one side thereof and two neighboring second heat sinks 22 at the other side thereof. A top end of each of the first, second and third heat sinks 21, 22, 23 is smaller than a bottom thereof, such that more heat from the LED light source will be dissipated to ambient air by the bottoms of the heat sinks 21, 22, 23 which are located close to the first surface 11 of the base 10. The first heat sink 21 has a frustoconical pole (not labeled) perpendicular to the base 10 and two opposite flat wings (not labeled) extending form the pole. Each of the third heat sinks 23 has a similar configuration as that the first heat sink 21. The flat wings extend along a lateral direction of the base 10. A smallest diameter of the frustoconical pole of the first heat sink 21 is greater than a largest diameter of the frustoconical pole of the third heat sinks 23. The third heat sinks 23 are offset from the first and second heat sinks 21, 22 along the lengthwise direction of the base 10, such that the heat dissipation efficiency of the heat sink group 20 can be improved. A cross section of the second heat sink 22 is approximately rectangular.

The fastening arms 30 are configured for fixing the illumination apparatus 100 to a supporter such as a lamp post (not shown). The two fastening arms 30 are respectively located at two opposite ends of the base 10, and the heat sink group 20 is located between the two fastening arms 30. Each of the fastening arms 30 is L-shaped, which includes a holding portion 31 perpendicular to the first surface 11 of the base 10 and a fixing portion 32 extending from a top of the holding portion 31 and parallel to the first surface 11 of the base 10. A profile of the holding portion 31 is approximate cuboid, and a height of the holding portion 31 is greater than that of the heat sink group 20. Especially, each of the holding portions 31 has a recess 311 back to the heat sink group 20, such that some materials of the holding portion 31 can be saved but still with good holding capability for the illumination apparatus 100. Furthermore, a weight of the illumination apparatus 100 can be decreased. The fixing portion 32 is approximate cuboid, which defines at least one through holes 321 spanning between the top and bottom surfaces thereof, for a fastener to extend therethrough to fix on the lamp post (not shown). The fastening arms 30 have recesses defined therein, without sacrificing strengths of the fastening arms 30, such that the required amount of material for constructing the illumination apparatus 100 can be decreased, and the illumination apparatus 100 accordingly can have a low cost.

While certain embodiments have been described and exemplified above, various other embodiments from the foregoing disclosure will be apparent to those skilled in the art. The disclosure is not limited to the particular embodiments described and exemplified but is capable of considerable variation and modification without departure from the scope of the appended claims.

What is claimed is:

1. An illumination apparatus comprising:
a base made of material with heat conducting conductibility, the base having a first surface and an opposite second surface, the second surface being configured for mounting a light source thereon;
a heat sink group placed on the first surface of the base, the heat sink group comprising three types of heat sinks arranged in a plurality of lines extending along a lengthwise direction of the base, and two outer lines of the heat sink group each consisting of a plurality of first heat sinks and a plurality of second heat sinks evenly spaced apart from the first heat sinks and alternating with the first heat sinks, and the two outer lines are symmetrical relative to a longitudinal median of the base, a middle line of the heat sink group being occupied by a plurality of third heat sinks spaced apart from each other, and each of the third heat sinks being located between two neighboring first heat sinks at one side thereof and two neighboring second heat sinks at the other side thereof; and
at least one fastening arm placed on the first surface of the base and adjacent to the heat sink group, the at least one fastening arm being configured for fixing the illumination apparatus on a supporter.

2. The illumination apparatus of claim 1, wherein the at least one fastening arm is L-shaped, and the at least one fastening arm comprises a holding portion perpendicular to the first surface of the base and a fixing portion extending from a top of the holding portion and parallel to the first surface of the base.

3. The illumination apparatus of claim 1, wherein the illumination apparatus comprises two fastening arms respectively located at two opposite ends of the base, and the heat sink group is located between the two fastening arms.

4. The illumination apparatus of claim 1, wherein a top end of each of the first heat sinks is smaller than a bottom end of each of the first heat sinks.

5. The illumination apparatus of claim 4, wherein each of the first heat sinks and the third heat sinks has a frustoconical pole perpendicular to the base and two opposite flat wings extending from the pole.

6. The illumination apparatus of claim 5, wherein the two opposite flat wings extend along a lateral direction of the base.

7. The illumination apparatus of claim 6, wherein a top end of the pole of each first heat sink is larger than a bottom end of the pole of each third heat sink.

8. The illumination apparatus of claim 1, wherein a retaining wall is located at an edge of the second surface of the base and extending along a direction away from the first surface, and a receiving space is bounded by the second surface of the base and the retaining wall, configured for receiving the light source therein.

9. The illumination apparatus of claim 1, wherein the base defines a through hole located at one end thereof, and the through hole spans between the first and second surfaces of the base and is configured for extension of an electrical wire therethrough.

10. The illumination apparatus of claim 1, wherein a plurality of locking portions are located at two opposite sides of the first surface of the base and configured for engaging with a cover of the illumination apparatus.

11. The illumination apparatus of claim 1, wherein the at least one fastening arm has a recess defined therein.

* * * * *